(12) United States Patent
Shen et al.

(10) Patent No.: US 10,170,597 B2
(45) Date of Patent: Jan. 1, 2019

(54) METHOD FOR FORMING FLASH MEMORY UNIT

(71) Applicant: Integrated Silicon Solution (Shanghai), Inc., Shanghai (CN)

(72) Inventors: Anxing Shen, Shanghai (CN); Chih-Kuang Lin, Shanghai (CN)

(73) Assignee: Integrated Silicon Solution (Shanghai), Inc., Pudong New Area, Shanghai (CN)

( * ) Notice: Subject to any disclaimer, the term of this patent is extended or adjusted under 35 U.S.C. 154(b) by 0 days.

(21) Appl. No.: 15/872,998

(22) Filed: Jan. 17, 2018

(65) Prior Publication Data

US 2018/0277664 A1  Sep. 27, 2018

(30) Foreign Application Priority Data

Mar. 27, 2017  (CN) .......................... 2017 1 0188415

(51) Int. Cl.
 *H01L 21/04* (2006.01)
 *H01L 29/66* (2006.01)
 *H01L 29/78* (2006.01)
 *H01L 29/423* (2006.01)
 *H01L 27/11543* (2017.01)
 (Continued)

(52) U.S. Cl.
 CPC ...... *H01L 29/66825* (2013.01); *H01L 21/046* (2013.01); *H01L 27/11541* (2013.01); *H01L 27/11543* (2013.01); *H01L 27/11558* (2013.01); *H01L 29/42328* (2013.01); *H01L 29/7841* (2013.01)

(58) Field of Classification Search
 None
 See application file for complete search history.

(56) References Cited

U.S. PATENT DOCUMENTS 9,129,852 B1 * 9/2015 Lee .................. H01L 27/115
2007/0158734 A1  7/2007 Chindalore
(Continued)

FOREIGN PATENT DOCUMENTS

CN  1945837 A   4/2007
CN  102201412 A  9/2011
(Continued)

*Primary Examiner* — Bradley Smith
(74) *Attorney, Agent, or Firm* — Jun He Law Offices P.C.; James J. Zhu

(57) ABSTRACT

A method for forming flash memory units is provided. After a logic gate in a select gate PMOS transistor area is separated from a logic gate in a control gate PMOS transistor area, P-type impurities implanted into the logic gate in the select gate PMOS transistor area are diffused into an N-type floating gate polysilicon layer to convert the N-type floating gate into a P-type floating gate by a subsequent high temperature heating process, so that it is possible to successfully form a select gate PMOS transistor having a small surface channel threshold value in a 55 nm process flash memory unit, and achieve mass production. Further, a two-step growth process of the logic gate and a process for separating the logic gate can form a surface channel of the select gate PMOS transistor having a smaller threshold value without affecting the floating gate doping of the control gate PMOS transistor.

10 Claims, 6 Drawing Sheets

(51) Int. Cl.
*H01L 27/11558* (2017.01)
*H01L 27/11541* (2017.01)

(56) References Cited

U.S. PATENT DOCUMENTS

| | | | | |
|---|---|---|---|---|
| 2009/0003074 | A1* | 1/2009 | Georgescu | G11C 16/0433 365/185.18 |
| 2015/0091080 | A1* | 4/2015 | Sun | H01L 29/7881 257/326 |
| 2018/0040375 | A1* | 2/2018 | Shen | G11C 16/0425 |

FOREIGN PATENT DOCUMENTS

| | | |
|---|---|---|
| CN | 104465522 A | 3/2013 |
| CN | 104037174 A | 9/2014 |

\* cited by examiner

METHOD FOR FORMING FLASH MEMORY UNIT

CROSS-REFERENCE TO RELATED APPLICATIONS

This application claims priority to Chinese patent application No. 201710188414.5 filed on Mar. 27, 2017, the entire content of which is incorporated herein by reference.

TECHNICAL FIELD

The present disclosure relates to a method for forming a semiconductor device, and more particularly, to a method for forming flash memory units.

BACKGROUND

Embedded 2T_pFlash memories are usually integrated into a system-on-chip, such as a subscriber identity module (SIM) card chip of a mobile phone, a smart bankcard chip or a microprogrammed control unit (MCU) chip, in form of an intellectual property (IP) core. Because of this feature, they are called "embedded" to distinguish from products of stand-along flash memories.

A single memory unit is formed by connecting two P-type metal-oxide-semiconductor (MOS) field transistors (a select gate transistor and a control gate transistor) in series, so it is called 2T_pFlash. The PMOS transistor is an elementary device for the modern very large scale integrated circuit. The PMOS transistor has four control terminals including a gate terminal, a drain terminal, a source terminal and a bulk terminal. The transistor can be turned on or off (corresponding to current on or off) by controlling the voltages applied to the four terminals. The select gate transistor is typically connected in series with the control gate transistor to form a "2T flash memory unit". A flash memory unit with a specific address can be selected or deselected to operate through the select gate transistor. The control gate transistor is a unit usually storing "0/1". Specific operations are performed to make the transistor to present different electric characteristics (e.g., different threshold voltages), so as to represent "0" or "1". The floating gate is usually embedded between the control gate and the silicon substrate of the control gate transistor to form a sandwich structure. The floating gate and the control gate are insulated by an oxide-nitride-oxide insulating film disposed therebetween, and the floating gate and the silicon substrate are insulated by an oxide insulating film. The floating gate itself is usually N-type or P-type doped polysilicon, which can be used to store charges to change the electric characteristics of the control gate PMOS transistor.

The embedded 2T pMOS flash memory array uses a NOR structure (as shown in FIG. 1), so as to ensure random access. A bit line (which is usually referred to as "BL" for short, e.g., BL 1-4) in FIG. 1 is used to control a voltage of a drain of a transistor. A word line (which is usually referred to as "WL" for short, e.g., WL 1-4) is used to control a voltage of a gate of the transistor. A source line (which is usually referred to as "SL" for short, e.g., SL 1-2) is used to control a voltage of a source of the transistor. In the NOR circuit structure, any one of the flash memory units can be read by applied different bias voltages to the BL/WL/SL lines. Taking the memory unit marked by a circuit shown in FIG. 1 as an example, the line SG-1 is used to turn on the select gate PMOS transistor, a suitable gate voltage is applied to the control gate PMOS transistor through the WL-1, and then "0"/"1" is determined based on whether there is a current between the BL-1 and the SL-1 dining a read operation (at this time, a voltage difference between the line BL-1 and the line SL-1 is equal to VCC, and VCC is usually 0.7~1.5V in a 55 nm process or below) during a read operation.

However, as a size of the embedded 2T pMOS flash memory device is getting smaller, conventional 0.13 μm process is no longer applicable.

SUMMARY

A method for forming flash memory units is provided according to embodiments of the present disclosure. A select gate PMOS transistor having a small surface channel threshold value can be successfully formed in a 55 nm-process flash memory unit, and mass production can be achieved.

In one embodiment, a method for forming flash memory units is provided. Each of the flash memory units includes a select gate PMOS transistor and a control gate PMOS transistor, and the method includes the steps of: providing a P-type substrate and forming an N-type well in the P-type substrate, wherein the N-type well includes a plurality of flash memory unit areas, each of which includes a select gate PMOS transistor area and a control gate PMOS transistor area; forming a channel area, a gate oxide layer, an N-type floating gate and an insulating layer sequentially for the select gate PMOS transistor and the control gate PMOS transistor in the flash memory unit area; etching a part or all of the insulating layer in the select gate PMOS transistor area, and forming a logic gate on the etched insulating layer in the flash memory unit area; implanting P-type impurities into the logic gate in the flash memory unit area, wherein a doping concentration of the logic gate is larger than a doping concentration of the N-type floating gate; separating the logic gate in the select gate PMOS transistor area from the logic gate in the control gate PMOS transistor area by etching; diffusing the P-type impurities in the logic gate of the select gate PMOS transistor area to the N-type floating gate in the select gate PMOS transistor area using a heating process, such that the N-type floating gate in the select gate PMOS transistor area changes to a P-type floating gate; and forming electrodes for the select gate PMOS transistor and the control gate PMOS transistor.

Compared with the conventional technology embodiments of the present disclosure have following advantages.

In the method for forming flash memory cells of the present disclosure, after the logic gate in the select gate PMOS transistor area is separated from the logic gate in the control gate PMOS transistor area, the P-type impurities implanted into the logic gate in the select gate PMOS transistor area are diffused into the N-type floating gate polysilicon layer to convert the N-type floating gate into a P-type floating gate using the subsequent high temperature heating process, so that it is possible to successfully form a select gate PMOS transistor having a small surface channel threshold value in a 55 nm-process flash memory unit, and achieve mass production.

Further, the two-step growth process of the logic gate and the process for separating the logic gate can form a surface channel of the select gate PMOS transistor having a smaller threshold value without affecting the floating gate doping of the control gate PMOS transistor, so as to obtain a higher quality for the flash memory unit.

Further, boron is used as the P-type impurities of the logic gate, and is beneficial to subsequent high temperature diffusion process.

Further, a single spacer is used at a first electrode side (i.e. the side not connected to the select gate PMOS transistor) of the control gate PMOS transistor. Therefore, the source line active area (SL AA) may not be covered by an oxide sidewall, so that SL AA silicide (there is no silicide formed in SL AA of the 0.13 μm 2T_pFlash technology node) can be formed to significantly reduce the resistance of an individual SL AA (from about 400 ohm/SL cell of the 0.13 μm 2T_pFlash technology node to about 30 ohm/SL cell of the 55 nm 2T_pFlash technology node), thereby significantly reducing the read operating voltage consumed by the resistance of SL AA and being conductive to improve a read current after a write operation.

Further, since the resistance of SL AA is significantly reduced, the flash memory array of 55 nm 2T_pFlash technology node can use 64 BLs/SL strap (0.13 μm 2T_pFlash technology node using 32 BLs/SL strap), thereby further saving an area of the flash memory array (saving about 3% of the area).

DETAILED DESCRIPTION OF THE PREFERRED EMBODIMENTS

In the following description, numerous technical details are set forth in order to provide a better understanding of the present application. However, it will be understood by those of ordinary skill in the art that the technical solutions required by the claims of the present application may be practiced without these technical details and variations and modifications based on the following embodiments.

In order to clarify the objectives, characteristics and advantages of the present disclosure, the embodiments of the present disclosure will be described in detail in conjunction with the accompanying drawings.

Figure 2:
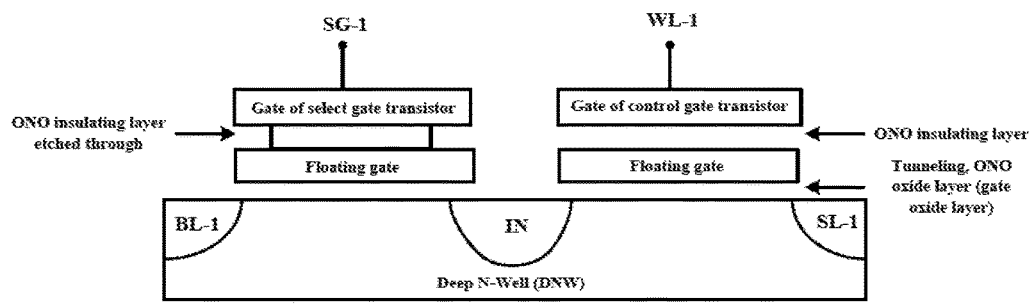
FIG. 2 is a structural diagram of a conventional flash memory unit.

The present disclosure relates to an embedded pMOS flash memory array, which uses a 2T pMOS unit structure. As shown in FIG. 2, a flash memory unit is formed by coupling a select gate PMOS transistor (whose gate voltage is controlled by SG-1) and a control gate PMOS transistor (whose gate voltage is controlled by WL-1) in series. Typically, in a 0.13 μm 2T pMOS unit structure, main process parameters for the select gate PMOS transistor are as follows: "a gate oxide layer with an electrical thickness of 8 nm~11 nm, a channel length of 100 nm~300 nm"; and main process parameters for the control gate PMOS transistor are as follows: "a gate oxide layer with an electrical thickness of 8 nm~11 nm (which is synchronously formed with the gate oxide of the select gate transistor, and thus has the same thickness), an ONO insulating layer (oxide-nitride-oxide film) with an electrical thickness of 10 nm~20 nm, an n-type polysilicon floating gate with a thickness of 20 nm~100 nm (which has a doping concentration greater than $1E+19$ $cm^{-3}$), and a channel length of 100 nm~300 nm". An internal-node junction (IN) is shared by these two PMOS transistors. When SL-1 is coupled to a high potential and BL-1 is coupled to a low potential, IN is equivalent to a drain of the control gate transistor, and is also a source of the select gate transistor.

In order to form a flash memory array having a regular arrangement, process steps for manufacturing an embedded 2T pMOS flash memory are described as follows.

1. Forming an active area. This step are employed mainly to form areas for making flash memory units on a monocrystalline silicon wafer, and to isolate various areas by shallow trench isolation (STI) process effectively. It will be appreciated that, in other embodiments of the present disclosure, other dielectric isolation processes, such as an isoplanar process or a local oxidation process, may be employed to isolate different areas.

2. Forming a deep N-well. As flash memory units of the embedded 2T pMOS flash memory are PMOS devices and the monocrystalline silicon wafer is usually p-type doped, this step is employed to form deep N-wells and dispose all flash memory unit devices in surrounding deep N-wells. It will be appreciated that, in other embodiments of the present disclosure, an n-type doped monocrystalline silicon wafer may be used to form the devices.

Figure 3A:
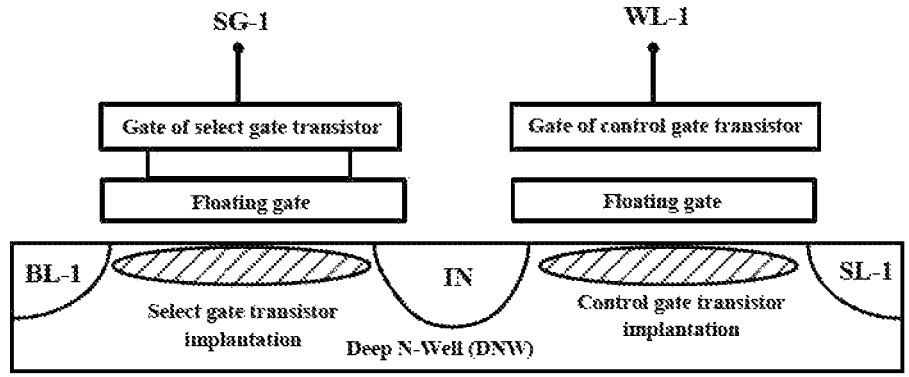
FIGS. 3A-3D are diagrams illustrating conventional process steps for forming a flash memory unit.

3. Performing threshold implantation of the select gate PMOS transistor. As it is desired to obtain a read current as big as possible in a read state, the select gate transistor coupled to the control gate transistor usually should have a threshold much smaller than that of the control gate PMOS transistor. As shown in FIG. 3A, this step aims to implant n-type impurities into a channel area of the select gate transistor and activate the impurities, so as to control the the value of the threshold of the select gate transistor. Generally, a range of threshold value of the select gate PMOS transistor is controlled to be from −0.5V to −1.5V. It should be noted that, the threshold implantation of the select gate PMOS transistor may simultaneously enter into channel areas of the select gate transistor and the control gate transistor.

Figure 3B:
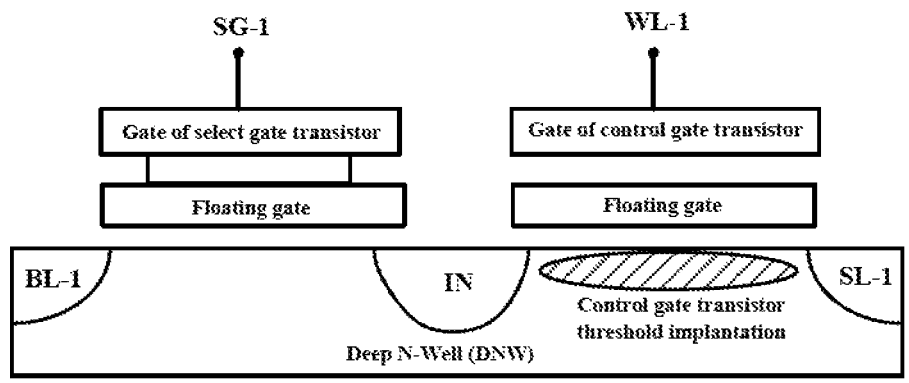

4. Performing threshold implantation of the control gate PMOS transistor. In order to prevent the occurrence of a punch-through effect of the control gate transistor in a programming state (IN coupled to high potential and SL-1 coupled to low potential), the threshold of the control gate transistor is usually higher than that of the select gate transistor, and should be precisely controlled. As shown in FIG. 3B, this step aims to implant n-type impurities into a channel area of the control gate transistor and activate the impurities, so as to control the value of the threshold of the control gate transistor. Generally, a threshold value range of the control gate PMOS transistor is controlled to be from −1.8V to −2.8V. As described in step 3, because the two processes of "threshold implantation of the select gate PMOS transistor" and "threshold implantation of the control gate PMOS transistor" are both performed on the channel area of the control gate transistor, the threshold of the control gate transistor is higher.

5. Forming a tunneling oxide layer. The tunneling oxide layer also serves as a gate oxide of the select gate transistor and the control gate transistor, and is typically formed by a "dry-oxygen thermal growth" process to ensure the quality of the oxide layer.

6. Forming an n-type polysilicon floating gate. This step mainly deposits and foam polysilicon on active areas of the flash memory array, and forms n-type heavily doped polysilicon floating gates by n-type ion implantation and activation.

7. Forming an ONO insulating layer and etching a portion of the ONO insulating layer. The ONO insulating layer includes three film layers, i.e. oxide, nitride and oxide layers from bottom to top. After this step, the ONO insulating layer and the tunneling oxide layer in the control gate transistor region will together isolate the floating gate from exterior regions, so as to ensure that electrons injected into the floating gate in a write/programming process can be stored for a long time. In the select gate transistor region, the ONO insulating layer may be removed by lithography and etching processes, to ensure that subsequent gate polysilicon is fully in contact with the floating gate polysilicon (i.e., the floating gate has a same functionality as the gate of the select gate transistor), and the completed select gate transistor can be considered as a normal single-gate PMOS transistor.

8. Forming gate polysilicon. This step first deposits a polysilicon film. Since both the select gate transistor and the control gate transistor are PMOS transistors, p-type ions are then implanted into the polysilicon film and activated to form p-type heavily doping. Finally, gates of the select gate transistor and the control gate transistor are formed by exposure and etching processes. Accordingly, the gate and the floating gate of the select gate transistor are an integral structure, while the gate and the floating gate of the control gate transistor are isolated by the ONO insulating layer.

9. Performing internal-node junction ion implantation. This step forms an IN junction by p-type ion implantation and activation. Since the 2T pMOS flash memory uses the band-to-band tunneling hot-electron injection (BBHE) effect to inject electrons from a node of the IN to the floating gate for writing/programming, there is specific requirement on the doping concentration and depth of the IN, and such process cannot be replaced by conventional P+ source/drain implantation.

Figure 3C:
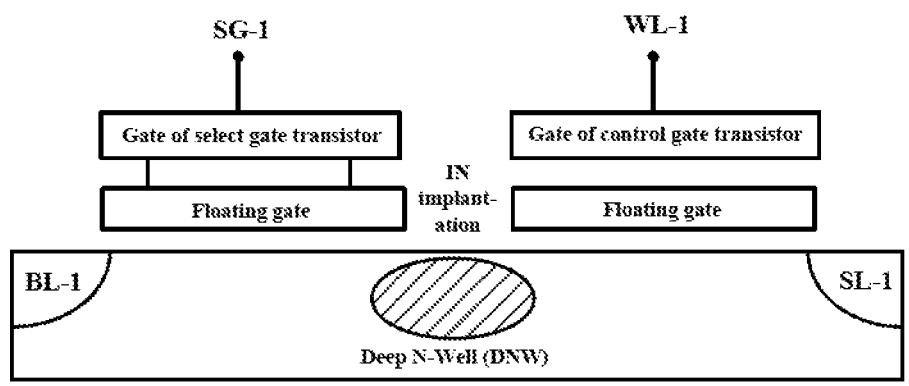
Figure 3D:
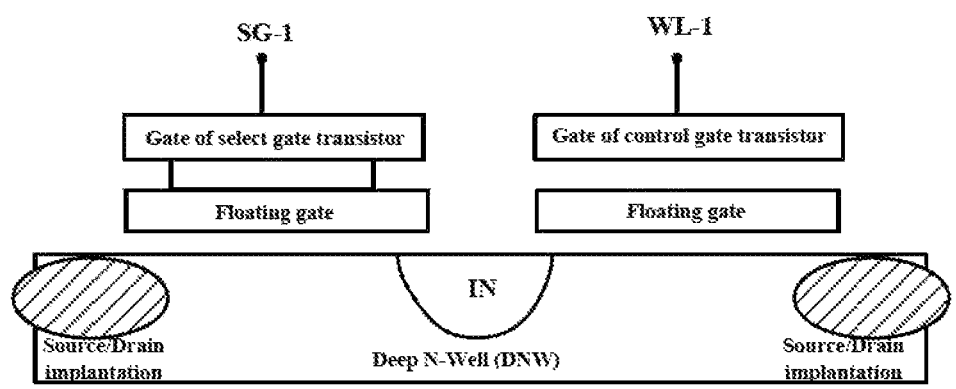

10. P+ source and drain implantation. As shown in FIG. 3D, this step mainly forms source and drain doping of the pMOS. The 2T pMOS flash memory device includes the two nodes labelled as BL-1 and SL-1 as shown in FIG. 3C.

11. Performing other back-end processes, such as forming contact through-holes, metal wires or passivation layers.

Generally, for the 2T_pFlash embedded flash memory of 0.13 μm node process, the select gate PMOS transistor uses a buried channel and an N-type gate. Its threshold voltage Should be smaller than −1.3V in order to avoid sub-threshold leakage, thereby achieving a reliability target of passing 100K thermal cycling.

For the 2T_pFlash embedded flash memory of 55 nm node process, the select gate pMOS transistor uses a surface channel and a P-type gate. Its threshold voltage can be smaller than −0.8V, so as to avoid the sub-threshold leakage, thereby achieving the reliability target of passing 100K thermal cycling.

The reason for forming the select gate pMOS transistor with the surface channel for the 2T_pFlash embedded flash memory of 55 nm node process is that, the size of the 55 nm 2T_pFlash unit flash memory is much smaller than that of the 0.13 μm 2T_pFlash unit flash memory (especially, the X-pitch representing the line width of the device is reduced to by a half, and the effective channel width is also reduced by a half, but the Y-pitch is not reduced too much). Moreover, the operating voltage of 55 nm node process is also lower than that of 0.13 μm node process. In this case, if the select gate PMOS transistor still uses the conventional buried channel, since its threshold voltage must be smaller than −1.3V to avoid the sub-threshold leakage, the read current of the programmed unit flash memory would be too small. Thus, the reliability target of passing 100K thermal cycling cannot be achieved.

In order to obtain better performance, inventors of the present disclosure made careful analysis and process integration in the research and development process, and chose the surface channel and the P-type gate for the select gate PMOS transistor. The advantages are that, the threshold voltage can be smaller than −0.8V and the sub-threshold leakage can be avoided, so that the read current of the programmed unit flash memory significantly increases and the reliability target of passing 100K cycling can be achieved. However, there are still some difficulties in practice. Since the 55 nm 2T_pFlash embedded flash memory technology uses the self-aligned floating gate technology, the floating gates of the select gate PMOS transistors are separated from each other, and are different from the floating gates (which are a line) of the select gate PMOS transistor of the 0.13 μm 2T_pFlash. Further, the self-aligned floating gate of the 55 nm 2T_pFlash embedded flash memory technology is first implanted with N-type dopants (such as phosphorus). Since the real floating gate of the control gate PMOS transistor is N-type doped, the conventional 0.13 μm process is no longer applicable, and it is difficult to obtain a high quality 55 nm 2T_pFlash embedded flash memory unit.

In view of the fact that the size of 55 nm is too small, the area which can be obtained by etching and doping using a larger size process may have various quality issues if processed by the 55 nm node process. In order to solve the quality issues, the present disclosure provides a method for forming a flash memory unit to meet the requirements of the 55 nm node process.

Figure 4:
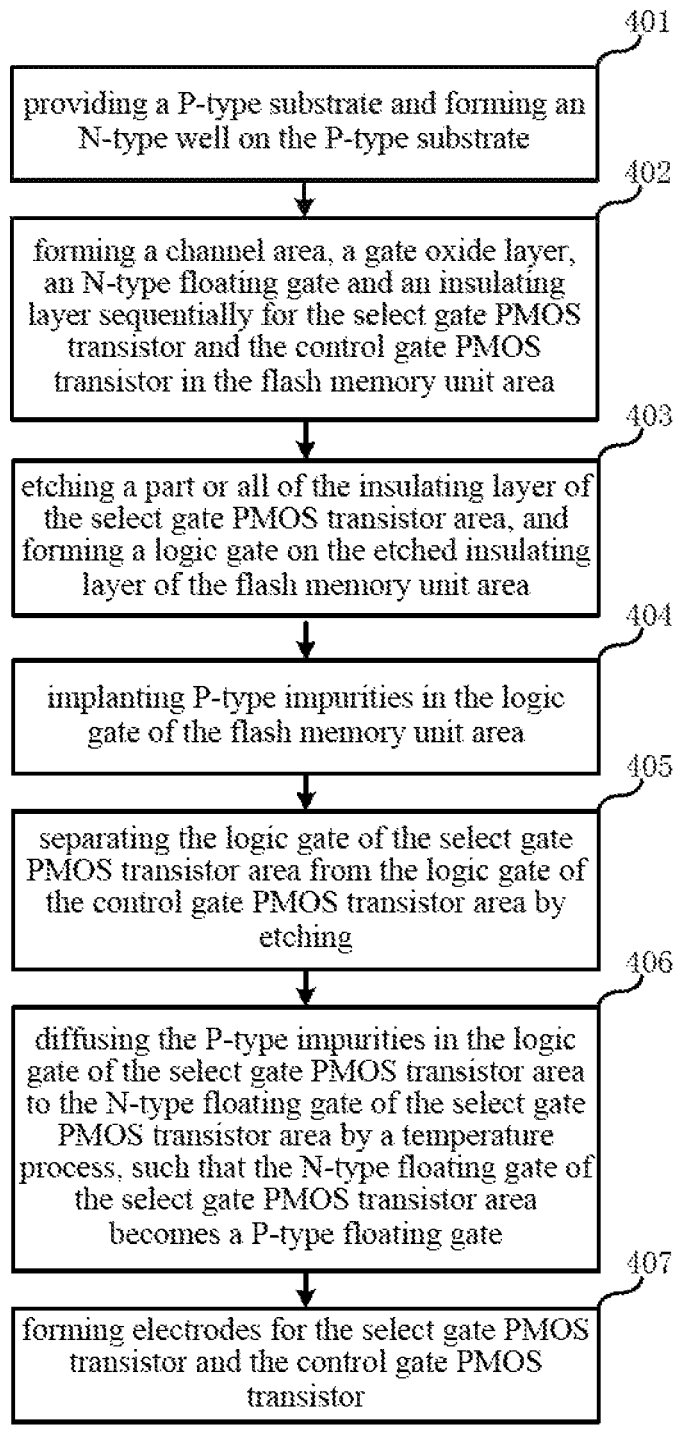
FIG. 4 is a flow chart of a method for forming flash memory units according to an embodiment of the present disclosure.

An embodiment of the present application relates to a method for forming a flash memory unit. FIG. 4 is a flow chart of the method for forming a flash memory unit. Each flash memory unit includes a select gate PMOS transistor and a control gate PMOS transistor. As shown in FIG. 4, the method for forming a flash memory unit includes following steps 401-407.

In step 401, a P-type substrate is provided and an N-type well is formed in the P-type substrate. The N-type well includes a plurality of flash memory unit areas, each of which includes a select gate PMOS transistor area and a control gate PMOS transistor area. It will be appreciated that, in other embodiments of the present disclosure, an N-type substrate may also be used to form the flash memory cells.

Thereafter, the process proceeds to step 402, where a channel region, a gate oxide layer, an N-type floating gate and an insulating layer of the select gate PMOS transistor and the control gate PMOS transistor are sequentially formed in the flash memory unit area. In view of the fact that these processes have been described in conjunction with FIGS. 3A-3D, the same description will not be described in detail herein.

Thereafter, the process proceeds to step 403, where a part or all of the insulating layer in the select gate PMOS transistor area is etched and a logic gate is formed on the etched insulating layer in the flash memory unit area. It will be appreciated that, a plasma etching process, a wet etching process or the like may be used to etch, and a chemical vapor deposition process, an electroplating process, a sputtering process or the like may be used for deposition to form layers with various thicknesses. In embodiments of the present disclosure, as long as an opening is formed on the floating gate of the select gate PMOS transistor for performing a subsequent counter-doping process, a portion of the insulating layer of the select gate PMOS transistor may he removed, or all of the insulating layer of the select gate PMOS transistor area may be removed.

Thereafter, the process proceeds to step 404, where P-type impurities are implanted into the logic gate of the flash memory unit area and a doping concentration of the logic gate is larger than a doping concentration of the N-type floating gate.

In some embodiments, the P-type impurity is boron. The reason for using boron as the P-type impurity of the logic gate is that, the atomic weight of boron is small and is beneficial for subsequent high temperature diffusion. In some embodiments, the concentration of ion implantation is $2*10^{15}/cm^{-3}$ to $6*10^{15}/cm^{-3}$ and the energy is 3-7 KeV. That is, the ion implantation process with high concentration and low energy is performed on the logic gate. It will be appreciated that, in other embodiments of the present disclosure, other P-type impurities or ion implantation parameters may also be employed, as long as the doping concentration of the logic gate is greater than the doping concentration of the N-type floating gate and the N-type floating gate of the select gate PMOS transistor area can change to a P-type floating gate after subsequent heating process is performed.

Thereafter, the process proceeds to step 405, where the logic gate in the select gate PMOS transistor area is separated from the logic gate in the control gate PMOS transistor area by etching. Any suitable conventional process may be used to separate the logic gate in the select gate PMOS transistor area from the logic gate in the control gate PMOS transistor area.

Thereafter, the process proceeds to step 406, where the P-type impurities in the logic gate in the select gate PMOS transistor area are diffused into the N-type floating gate in the select gate PMOS transistor area using a heating process, such that the N-type floating gate in the select gate PMOS transistor area changes to a P-type floating gate. Likewise, the heating process herein may employ any conventional heating process.

Thereafter, the process proceeds to step 407, where electrodes for the select gate PMOS transistor and the control gate PMOS transistor are formed. Then, subsequent processes, such as processes for forming contacts, metal connects and passivation layers, may be performed, which are well known to those skilled in the art and will not be described here.

It will be appreciated that, prior to step 405, heating processes are not carried out at a temperature higher than 600 degrees Celsius. The insulating layer may be a silicon dioxide-silicon nitride-silicon dioxide insulating layer.

In the method for forming flash memory cells according embodiments of the present disclosure, after the logic gate in the select gate PMOS transistor area is separated from the logic gate in the control gate PMOS transistor area, the P-type impurities implanted into the logic gate in the select gate PMOS transistor area are diffused into the N-type floating gate polysilicon layer to convert the N-type floating gate into a P-type floating gate using the subsequent high temperature heating process, so that it is possible to successfully form a select gate PMOS transistor having a small surface channel threshold value in a 55 nm-node flash memory unit, and achieve mass production.

It can be seen from the above, the counter-doping process must be used in order to form the select gate PMOS transistor of the 55 nm 2T_pFlash technology node with the surface channel and the P-type gate. That is, a special mask for etching flash memory gates may be used to separate the select gate and the control gate of the flash memory, and then the high concentration and low energy boron do ants implanted into the logic gate of the flash memory part are diffused into the N-type floating gate under the select gate using the subsequent high temperature heating process. As a result, the N-type floating gate is turned into a P-type floating gate, which is the so-called counter-doping process. The quality of the 55 nm flash memory unit formed is high.

It should be noted that, no high temperature process is performed before separating the select gate of the flash memory from the control gate, because the high temperature process may diffuse the high concentration and low energy boron doped into the logic gate of the flash memory part into the floating gate under the control gate through the select gate, and thus the doping type of the floating gate under the control gate cannot be controlled.

In order to achieve this innovative process, detailed arrangements are made in the process integration. First, an opening is formed on the floating gate of the select gate PMOS transistor for the subsequent counter-doping. In order to form the opening, a two-step growth process are used to form the logic gate based on careful research and full consideration.

Figure 5:
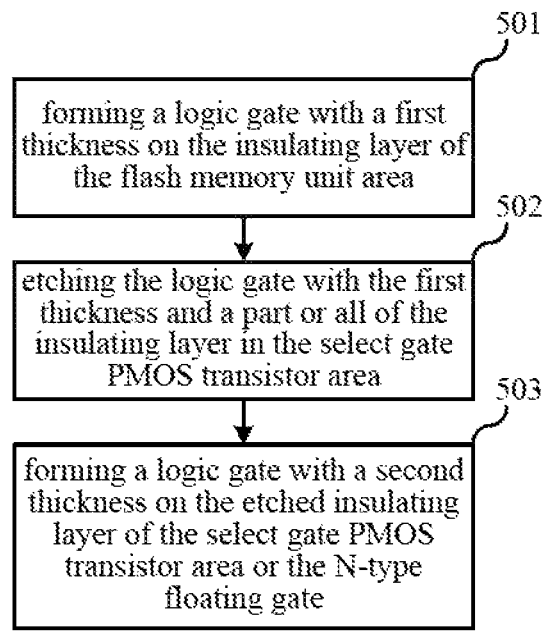
FIG. 5 is a flow chart of steps for forming a logic gate in a method for forming flash memory units according to an embodiment of the present disclosure.

In an embodiment, as shown in FIG. 5, step 403 may include following sub-steps 501-503.

In step 501, a logic gate with a first thickness is formed on the insulating layer in the flash memory unit area.

Thereafter, the process proceeds to step 502, where the logic gate with the first thickness and a part or all of the insulating layer in the select gate PMOS transistor area are etched.

Thereafter, the process proceeds to step 503, where a logic gate with a second thickness is formed on the etched insulating layer in the select gate PMOS transistor area or on the N-type floating gate, and the second thickness is larger than the first thickness. Optionally, the first thickness is 200-500 Å and the second thickness is 500-1000 Å. For example, the first thickness is 300 Å and the second thickness is 700 Å.

That is, a logic gate with a thickness of 200-500 Å may be grown first, and then a mask may be used to remove the logic gate with the thickness of 200-500 Å and ONO on the floating gate of the select gate PMOS transistor. Afterwards, a logic gate with a thickness of 500-1000 Å may be gown.

The two-step growth is an alternative process for forming the surface channel of the select gate PMOS transistor. The two-step growth process of the logic gate and the process for separating the logic gates can form a surface channel of the select gate MOS transistor having a smaller threshold value without affecting the floating gate doping of the control gate PMOS transistor, so as to obtain high-quality flash memory units.

In addition, it will be appreciated that, in other embodiments of the present disclosure, direct etching or other processes may be employed as long as an opening is formed on the floating gate of the select gate PMOS transistor.

Figure 6:
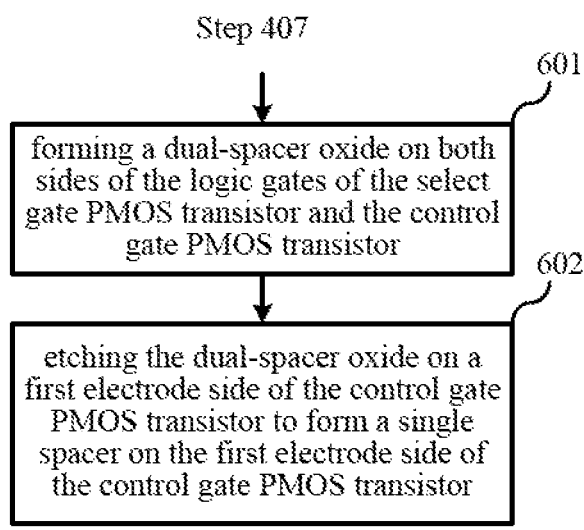
FIG. 6 is a flow chart of steps for forming single spacer in a method for forming flash memory units according to another embodiment of the present disclosure.

Another embodiment of the present disclosure relates to a method for forming flash memory units. FIG. 6 is a flow chart showing formation of a single spacer in the method for forming the flash memory unit.

This embodiment differs from the above embodiment in that, a single spacer is used at a first electrode side (i.e., the side not connected to the select gate PMOS transistor) of the control gate PMOS transistor. Therefore, the source line active area (SL AA) may not be covered by an oxide sidewall, so that SL AA silicide (there is no silicide formed in SL AA of the 0.13 µm 2T_pFlash technology node) can be formed to significantly reduce the resistance of an individual SL AA (from about 400 ohm/SL cell of the 0.13 µm 2T_pFlash technology node to about 30 ohm/SL cell of the 55 nm 2T_pFlash technology node), thereby significantly reducing the read operating voltage consumed by the resistance of SL AA and being conductive to improve a read current after a write operation.

Figure 1:
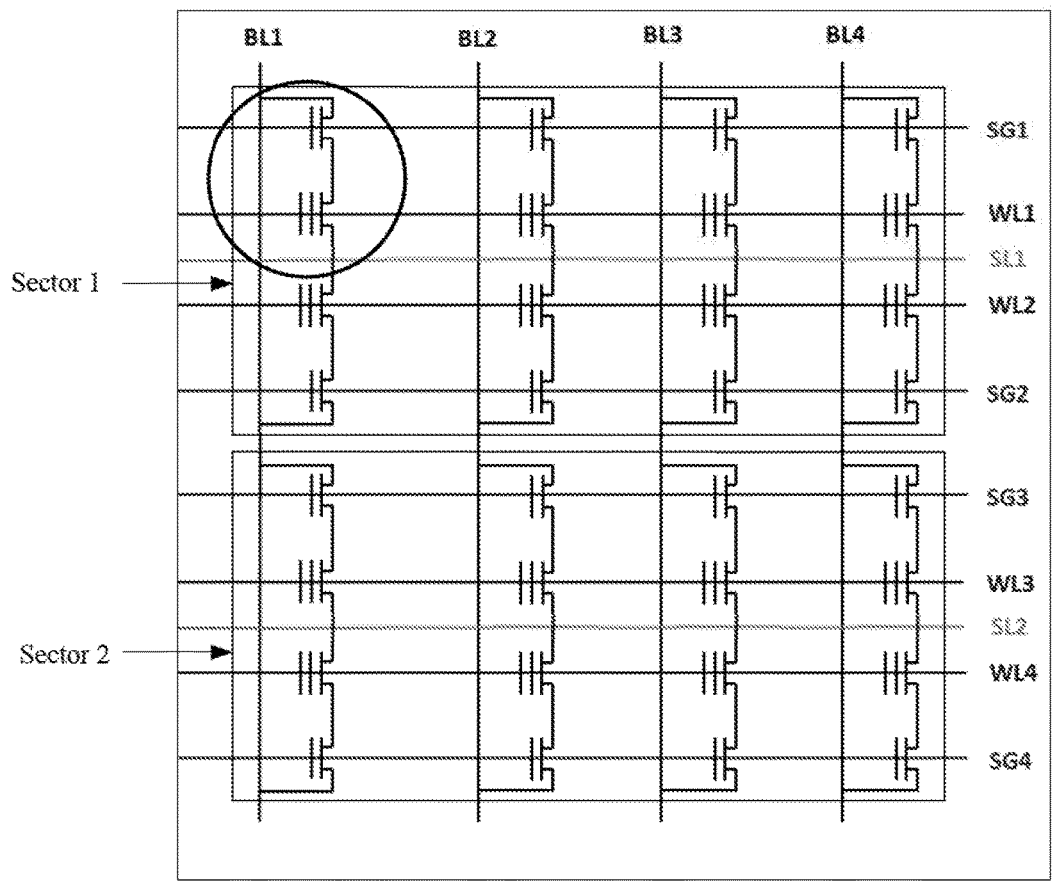
FIG. 1 is a diagram of a conventional flash memory array.

Specifically, a plurality of flash memory units of at least one sector (e.g., sector 1 and sector 2 in FIG. 1) form a rectangular array in an N-type well.

In step 407, a first electrode of the select gate PMOS transistor is connected to a second electrode of the control gate PMOS transistor.

As shown in FIG. 6, the following steps may also be performed after step 407.

In step 601, a dual-spacer oxide is formed at both sides of logic gates of the select gate PMOS transistor and the control gate PMOS transistor.

Thereafter, the process proceeds to step 602, where the dual-spacer oxide at a first electrode side of the control gate PMOS transistor is etched to form a single logic spacer at the first electrode side of the control gate PMOS transistor.

In other words, in an embodiment, a specific mask is used to etch and remove the dual spacer oxide (made of $SiO_2$) at the side of the source line (SL), then the mask photo-resist is removed, and then a spacer etch process is performed. With the high $SiO_2$ to SiN selectivity ratio of etching, a single spacer oxide etching process may be performed to form a single logic spacer and a dual HV spacer in accordance with the process design.

In some embodiments, the following steps may also be performed after step 602.

In the rectangular array, second electrodes of the select gate PMOS transistors located in each column are connected together to form a first control line (i.e., BL line), and first electrodes of the control gate PMOS transistors of each sector are connected together to form a second control line (i.e., SL line), wherein every 64 first control lines have a contact for coupling to the second control lines. Since the resistance of SL AA is significantly reduced, the flash memory array of 55 nm 2T_pFlash technology node can use 64BLs/SL strap. (0.13 µm 2T_pFlash technology node using 32BLs/SL strap), thereby further saving the flash memory array area (saving about 3% of the area).

Figure 7:
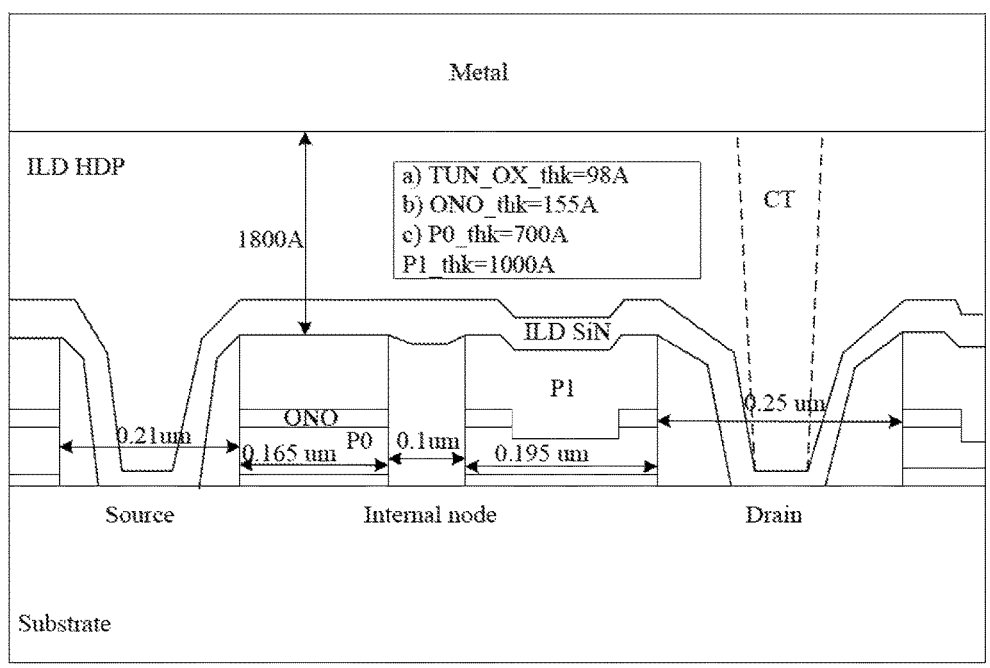
FIG. 7 is a structural diagram of a flash memory unit according to another embodiment of the present disclosure.

FIG. 7 shows an exemplary structural diagram of a flash memory unit formed using the method of the present disclosure. As can be seen from FIG. 7, the insulating layer of the select gate PMOS transistor is partially etched to form an opening on the floating gate of the select gate PMOS transistor for performing subsequent counter-doping, and the logic gate of the select gate PMOS transistor is shown as P1. The floating gate P0 of the control gate PMOS transistor is not affected, and a singer spacer is formed at the source side of the control gate PMOS transistor. It will be appreciated that, the flash memory unit of FIG. 7 may be formed by improvements of the preparation method of the present disclosure, but the improvements of the preparation method of the present disclosure may also be used separately.

In summary, a plurality of improvements are made to fabrication processes of the embedded 2T_pFlash flash memory device in embodiments of the present disclosure, and the bottleneck that the current is small after the 55 nm node flash memory device is programmed can be resolved. Mass production of the 55 nm node embedded flash memory can be realized, and a solid foundation is made for further development of more advanced embedded flash memory technologies (40 nm, 28 nm, etc.).

It should be noted that, in the claims and the specification of the present disclosure, relational terms such as "first" and "second" are used only to distinguish an entity or an operation from another entity or operation without necessarily requiring or suggesting that there is any such actual relationship or sequence between these entities or operations. Moreover the term "comprising", "including" or any other variant thereof is intended to encompass a non-exclusive inclusion such that processes, methods, articles, or devices that include a series of elements include not only those elements but also those that are not explicitly listed, or other elements that are inherent to such processes, methods, articles, or devices. In the absence of more restrictions, the elements that are limited by the statement "including one" do not exclude the presence of additional elements in the process, method, article, or device that includes the elements.

While the invention has been illustrated and described with reference to certain preferred embodiments of the invention, it will be understood by those of ordinary skill in the art that various changes may be made in form and detail without departing from the spirit and scope of the invention.

What is claimed is:

1. A method for forming flash memory units, each of the flash memory units comprising a select gate PMOS transistor and a control gate PMOS transistor, the method comprising the steps of:
   providing a P-type substrate and forming an N-type well in the P-type substrate, wherein the N-type well comprises a plurality of flash memory unit areas each comprising a select gate PMOS transistor area and a control gate PMOS transistor area;
   forming a channel area, a gate oxide layer, an N-type floating gate and an insulating layer sequentially for the select gate PMOS transistor and the control gate PMOS transistor in the flash memory unit area;
   etching a part or all of the insulating layer in the select gate PMOS transistor area, and forming a logic gate on the etched insulating layer in the flash memory unit area;
   implanting P-type impurities into the logic gate in the flash memory unit area, wherein a doping concentration of the logic gate is larger than a doping concentration of the N-type floating gate;
   separating the logic gate in the select gate PMOS transistor area from the logic gate in the control gate PMOS transistor area by etching;
   diffusing the P-type impurities in the logic gate in the select gate PMOS transistor area to the N-type floating gate in the select gate PMOS transistor area using a heating process, such that the N-type floating gate in the select gate PMOS transistor area changes to a P-type floating gate; and
   forming electrodes for the select gate PMOS transistor and the control gate PMOS transistor.

2. The method of claim 1, wherein the step of etching a part or all of the insulating layer in the select gate PMOS transistor area, and forming a logic gate on the etched insulating layer in the flash memory unit area comprises the sub-steps of:
   forming a logic gate with a first thickness on the insulating layer in the flash memory unit area;

etching the logic gate with the first thickness and a part or all of the insulating layer in the select gate PMOS transistor area; and forming a logic gate with a second thickness on the etched insulating layer in the select gate PMOS transistor area or the N-type floating gate, wherein the second thickness is larger than the first thickness.

3. The method of claim 1, wherein, in the step of implanting P-type impurities into the logic gate of the flash memory unit area, the P-type impurities are boron.

4. The method of claim 1, wherein, in the step of implanting P-type impurities into the logic gate in the flash memory unit area, a concentration of the ion implantation is $2*10^{15}/cm^{-3}$-$6*10^{15}/cm^{-3}$, and an energy of the ion implantation is 3-7 KeV.

5. The method of claim 2, wherein the first thickness is 200-500 Å, and the second thickness is 500-1000 Å.

6. The method of claim 5, wherein the first thickness is 300 Å, and the second thickness is 700 Å.

7. The method of claim 1, wherein a plurality of flash memory units of at least one sector form a rectangular array in the N-type well;

in the step of forming electrodes for the select gate PMOS transistor and the control gate PMOS transistor, a first electrode of the select gate PMOS transistor is coupled to a second electrode of the control gate PMOS transistor; and after the step of forming electrodes for the select gate PMOS transistor and the control gate PMOS transistor, the method further comprises the steps of:

forming a dual-spacer oxide at both sides of the logic gates of the select gate PMOS transistor and the control gate PMOS transistor; and etching the dual-spacer oxide at a first electrode side of the control gate PMOS transistor to form a single spacer at the first electrode side of the control gate PMOS transistor.

8. The method of claim 7, wherein, after the step of etching the dual-spacer oxide at a first electrode side of the control gate PMOS transistor to form a single spacer at the first electrode side of the control gate PMOS transistor", the method further comprises the step of:

in the rectangular array, coupling together the second electrodes of the select gate PMOS transistors located in each column to form a first control line, and coupling together the first electrodes of the control gate PMOS transistors of each sector to form a second control line, wherein each 64 first control lines have a contact for coupling to the second control lines.

9. The method of claim 1, wherein, before the step of separating the logic gate in the select gate PMOS transistor area from the logic gate of the control gate PMOS transistor area by etching, no heating process is carried out at a temperature greater than 600 degrees Celsius.

10. The method of claim 1, wherein the insulating layer is a silicon dioxide-silicon oxide-silicon dioxide insulating layer.

* * * * *